United States Patent [19]
White

[11] Patent Number: 5,337,028
[45] Date of Patent: Aug. 9, 1994

[54] MULTILAYERED DISTRIBUTED FILTER

[75] Inventor: Curtis B. White, Rockford, Ill.

[73] Assignee: Sundstrand Corporation, Rockford, Ill.

[21] Appl. No.: 889,211

[22] Filed: May 27, 1992

[51] Int. Cl.$^5$ .............................................. H03H 7/09
[52] U.S. Cl. .................... 333/181; 333/185; 336/69; 361/270
[58] Field of Search ................ 333/12, 177, 181, 184, 333/185; 336/69, 70, 177, 223, 229; 174/32; 361/118, 119, 270, 328

[56] References Cited

U.S. PATENT DOCUMENTS

| | | | |
|---|---|---|---|
| 2,521,513 | 9/1950 | Gray | 315/243 |
| 3,210,706 | 10/1965 | Book | 336/183 |
| 3,638,155 | 1/1972 | Combs | 336/69 |
| 3,704,390 | 11/1972 | Grahame | 315/276 |
| 3,775,720 | 11/1973 | Winn | 336/69 |
| 4,327,311 | 4/1982 | Wroblewski | 315/244 |
| 5,083,101 | 1/1992 | Frederick | 333/185 X |
| 5,153,812 | 10/1992 | Naito | 333/185 X |

FOREIGN PATENT DOCUMENTS 68708 4/1985 Japan ................................. 333/181

OTHER PUBLICATIONS

Ashok Bindra, "Integrated, Planar Approaches Boost Performance" *Electronic Engineering Times,* Apr. 13, 1992; pp. 45, 48, 61.

*Primary Examiner*—Paul Gensler
*Attorney, Agent, or Firm*—Marshall, O'Toole, Gerstein, Murray & Borun

[57] ABSTRACT

The present invention reduces the volume and weight of capacitive and inductance devices, particularly used in filters, by combining the capacitive elements and inductive elements into the same construction. Accordingly, alternating conducting and dielectric sheets of material are wound into a coil. The conducting sheets can be variously connected to signal lines and to ground in order to form common mode, differential mode and/or mixed mode filters.

16 Claims, 9 Drawing Sheets

MULTILAYERED DISTRIBUTED FILTER

FIELD OF THE INVENTION

The present invention relates to a combined capacitive/inductive device, and, more particularly, to a capacitive/inductive filter having multiple layers of interleaved dielectric and conducting materials wound in a coil for use as a differential mode, common mode or mixed mode filter depending upon the number and arrangement of layers.

BACKGROUND OF THE INVENTION

Electronic systems, particularly those used on aircraft, require weight and volume efficiency. The efficiency of an aircraft is a function of the payload which the aircraft can carry for the available thrust. Payload is most often measured in terms of revenue generating weight. That is, the more revenue generating weight that an aircraft can carry for the available thrust, the more efficient the aircraft becomes. Ideally, the ratio of payload (i.e. the revenue generating weight) to aircraft weight (i.e. the weight of the aircraft itself without payload) can be maximized by reducing aircraft weight. Aircraft weight and volume can be reduced, in turn, by reducing the weight and volume of the components which are part of the air frame structure. These components include not only the structural elements of the air frame but also the aircraft's electronics.

There are many-electronic systems on an aircraft for providing a variety of tasks such as power generation and regulation, communications, and control of air surfaces. These electronic systems typically generate, and are susceptible to, electromagnetic interference. As a result, such electronic systems rely extensively upon filtering. For example, filters are used in an aircraft's electronic systems for filtering out undesired harmonics, for transient suppression, and for a variety of other tasks all generally related to reducing or eliminating undesired signals on the electrical transmission paths of the these electronic systems.

These filters include, inter alia, differential mode filters for filtering out undesired signals which are conducted on one transmission path relative to another path, common mode filters for filtering out undesired signals being conducted on two or more transmission paths (typically where such signals change simultaneously and by the same amount relative to some common reference such as ground), and mixed mode filters for filtering out both undesired differential mode and undesired common mode signals. Such filters are typically constructed discretely by winding wire on a ferromagnetic core to form inductors and connecting the inductors in series with capacitors. This type of construction results in undesirably large and heavy filter components for electronic systems.

SUMMARY OF THE INVENTION

The present invention reduces the volume and weight of capacitive/inductive devices, particularly used in filters, by combining the capacitive elements and inductive elements into the same construction. A capacitive-/inductive device according to the present invention includes alternating sheets of conducting material and dielectric material which are wound into a coil. The conducting sheets can be connected to signal lines and to ground in a variety of ways in order to form common mode, differential mode and mixed mode filters.

Thus, according to one aspect of the invention, first, second, third and fourth sheets of material are wound into a coil. The first and third sheets are dielectric sheets, and the second and fourth sheets are conducting sheets. One of the conducting sheets is connected to ground and the ends of the other conducting sheet are connected in a signal line. Thus, the conducting sheet connected in the signal line forms an inductor, and the two conducting sheets separated by a dielectric sheet form a capacitor for shunting undesirable signals to ground.

According to another aspect of the invention, five conducting sheets are interleaved with five dielectric sheets so that each conducting sheet is separated from adjacent conducting sheets by a sheet of dielectric material. These ten sheets are wound in a coil, and every other conducting sheet is connected to ground. The ends of the remaining conducting sheets are connected into two signal lines. This arrangement, accordingly, forms a common mode filter having a first inductor and a first capacitor for one signal line and a second inductor and a second capacitor for the other signal line. Thus, each side of the common mode filter shunts to ground undesired signals on its respective signal line.

According to a further aspect of the invention, N layers are wound into a coil wherein each layer includes an elongated dielectric sheet and an elongated conducting sheet, wherein each elongated dielectric sheet separates adjacent elongated conducting sheets, and wherein N is a number greater than 2.

BRIEF DESCRIPTION OF THE DRAWINGS

These and other features and advantages will become more apparent from a detailed consideration of the invention when taken in conjunction with the drawings in which.

DETAILED DESCRIPTION

Figure 1:
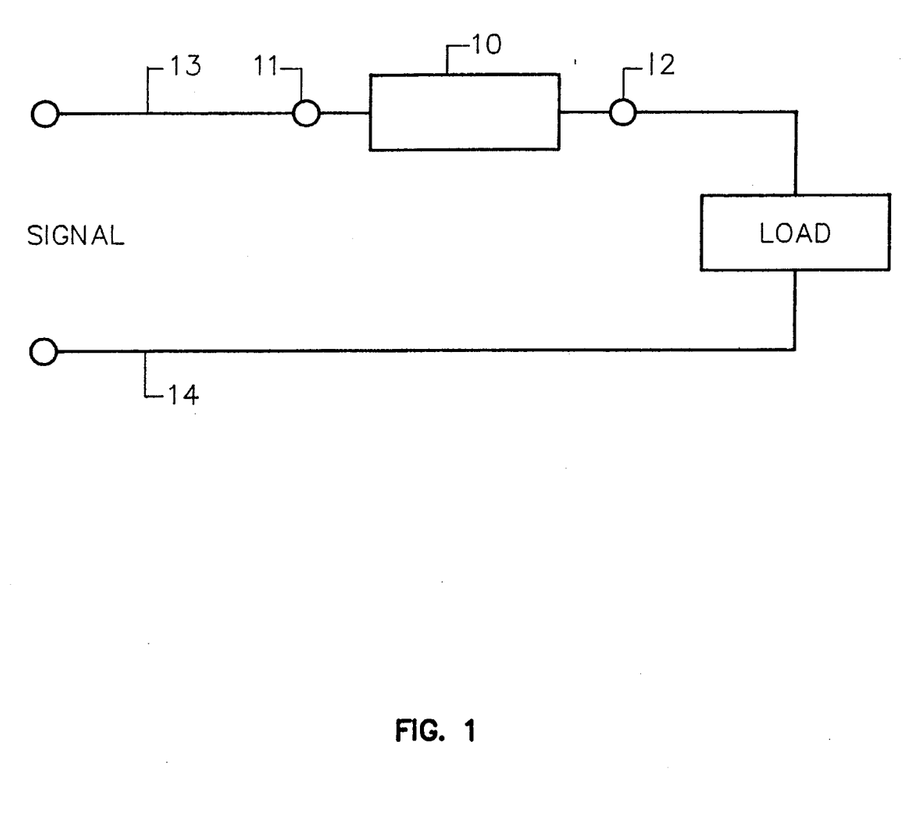
FIG. 1 is a schematic diagram of a differential mode filter connected between a signal input and a load.

A differential mode filter 10, as shown in FIG. 1, has a signal side terminal 11 and a load side terminal 12. The differential mode filter 10 is used to attenuate an undesired signal on signal line 13 which has a potential which changes with respect to a signal line 14 (which may also be referred to as a return line).

Figure 2:
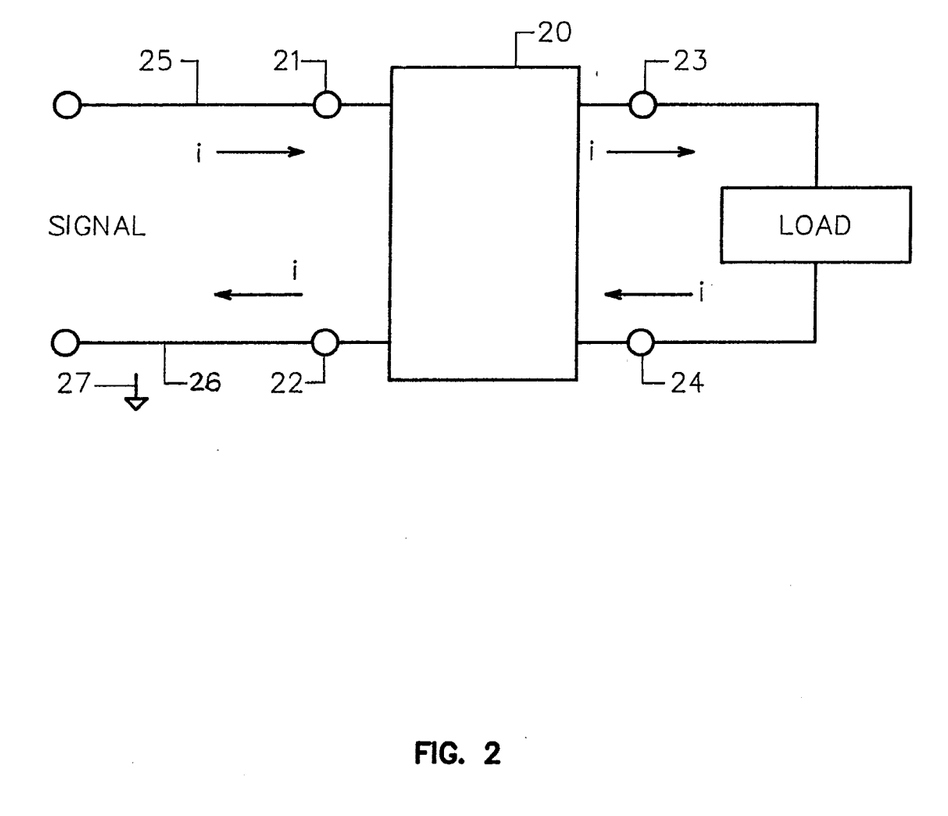
FIG. 2 is a schematic diagram of a common mode filter connected between a signal input and a load.

FIG. 2, on the other hand, shows a common mode filter 20 having signal side terminals 21 and 22 and load side terminals 23 and 24. These load side terminals 23 and 24 are connected to a load and the signal side terminals 21 and 22 are connected to signal lines 25 and 26, respectively. Current flows in the direction of the arrows. The common mode filter 20 attenuates undesired signals on the signal lines 25 and 26. These undesired signals typically change simultaneously and by the same amount relative to a common reference such as ground 27.

While the present invention is applicable to a differential mode filter such as that shown in FIG. 1, a common mode filter such as that shown in FIG. 2, and a mixed mode filter which is a combination of a differential mode filter and a common mode filter, only common mode filters are discussed in detail hereinbelow.

Figure 3:
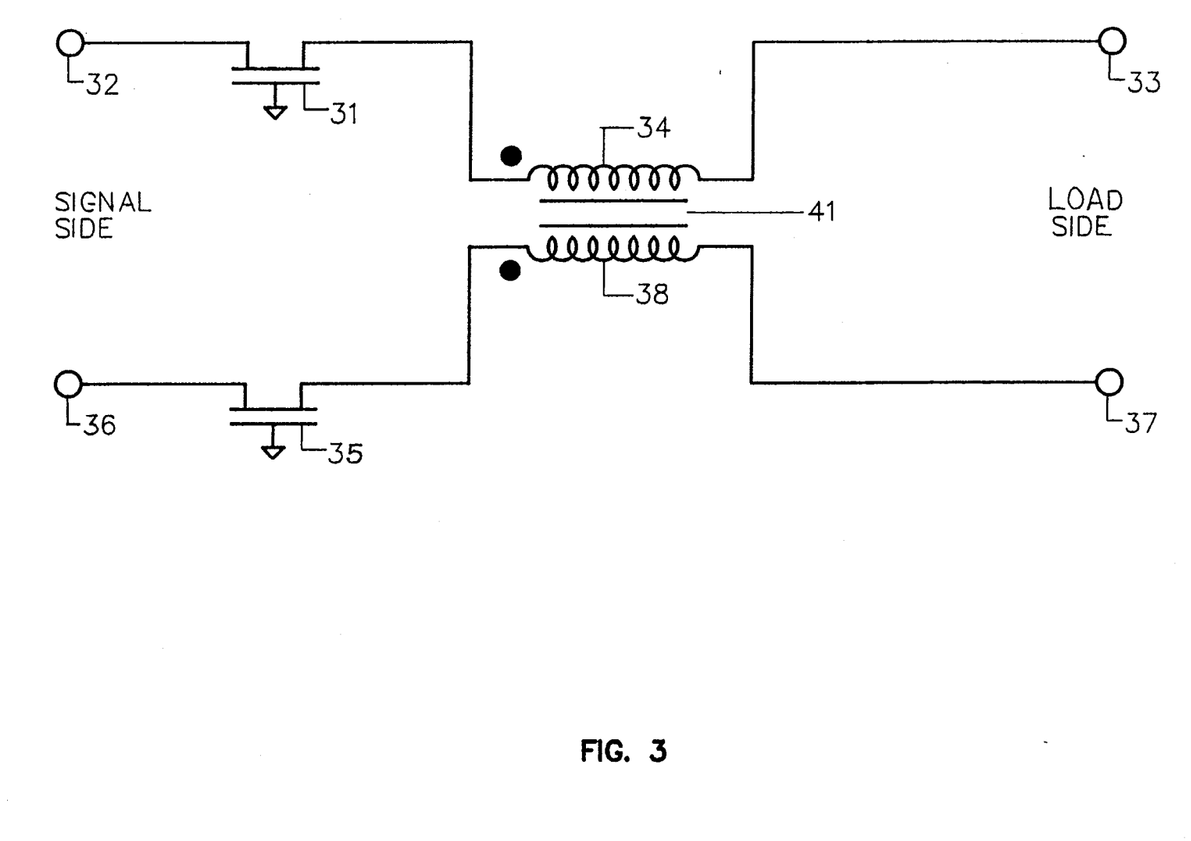
FIG. 3 shows a common mode filter in detail.

A typical common mode filter 20 is shown in FIG. 3. The common mode filter 20 includes capacitors 31 and 35 as well as inductors 34 and 38. The inductors 34 and 38 are inductively coupled by mutual inductance to oppose common mode currents. A first plate of the capacitor 31 is connected to a supply side terminal 32 and a second plate is connected to ground. The first plate of the capacitor 31 is also connected to a load side terminal 33 through the inductor 34. A first plate of the capacitor 35 is connected to a supply side terminal 36 and a second plate is connected to ground. The first plate of the capacitor 35 is also connected to a load side terminal 37 through the inductor 38. The values of the capacitors 31 and 35 and the inductors 34 and 38 are selected to attenuate signals having predetermined frequencies. The inductors 34 and 38 are typically wound from wire around a common ferromagnetic core such as core 41 shown in FIG. 4.

The effectiveness of the filter shown in FIG. 3 relative to performance, weight and volume is compromised by performance limitations of the lumped components 31, 34, 35 and 38 over the wide frequency ranges typically mandated by customer specifications. These limitations are especially apparent for common mode filters. Because the inductors of such filters are currently wound from wire on a common ferromagnetic core, the performance of these inductors is limited by the conflicting needs for sufficient inductance for low frequency performance and for minimal stray capacitance coupling between inductor turns for high frequency performance. These stray capacitances at higher frequencies are shown in FIG. 4.

Figure 4:
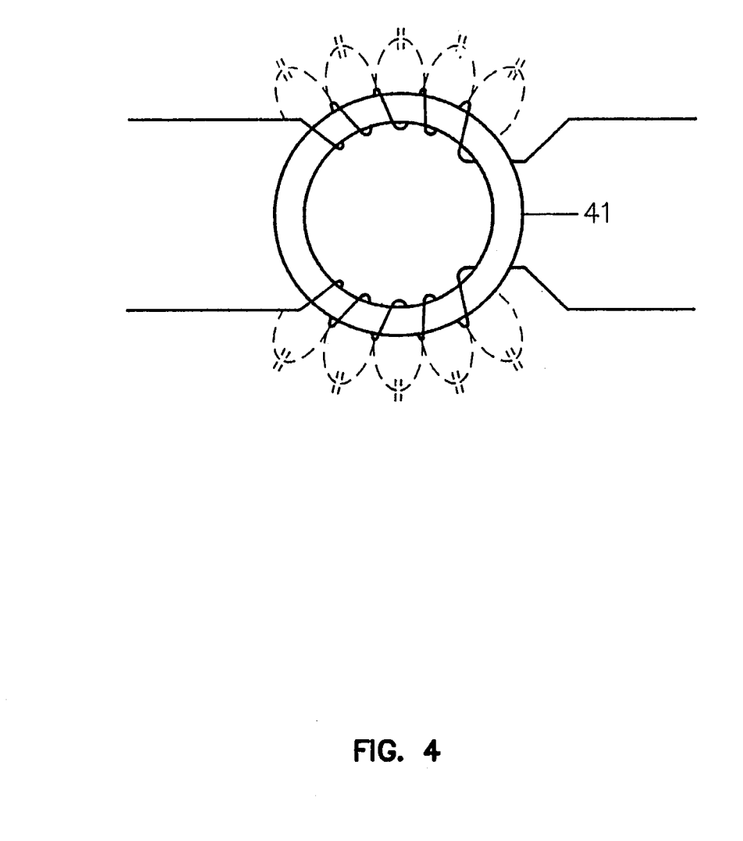
FIG. 4 is illustrative of the stray capacitances associated with the choke of the common mode filter shown in FIG. 3.
Figure 5:
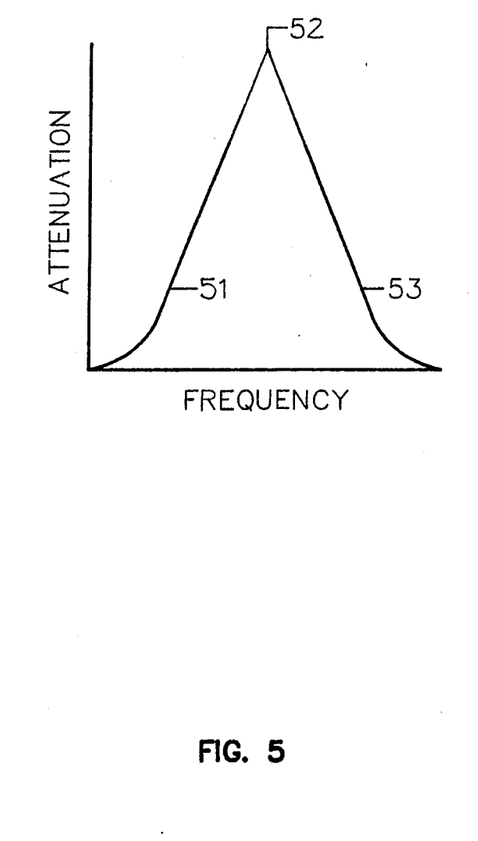
FIG. 5 is a graph showing attenuation as a function of frequency for the common mode filter shown in FIG. 3.

FIG. 5 shows the attenuation as a function of frequency provided by an inductor such as that shown in FIG. 4. Portion 51 of this curve represents a loss of attenuation due to lack of inductance provided by the inductor itself. Portion 52 represents the peak attenuation at self-resonance of the inductor. Portion 53 shows the loss of attenuation due to the undesired stray capacitances between windings of the choke coil. These stray capacitances dominate the performance of the inductor above resonance. As can be seen from FIG. 5, the effects of stray capacitance increases with frequency. Ideally, this stray capacitance effect should not occur until very high frequencies are experienced.

The present invention achieves improvements in weight and volumetric efficiency of such filters by combining the capacitive and inductive elements of the filters into the same capacitive/inductive device. This device distributes its capacitance and inductance to permit greater inductance and to greatly reduce the opportunity for undesired signals to bypass the filter by way of stray capacitances between the turns of the inductor. Accordingly, the attenuation performance of the device is enhanced.

Figure 6:
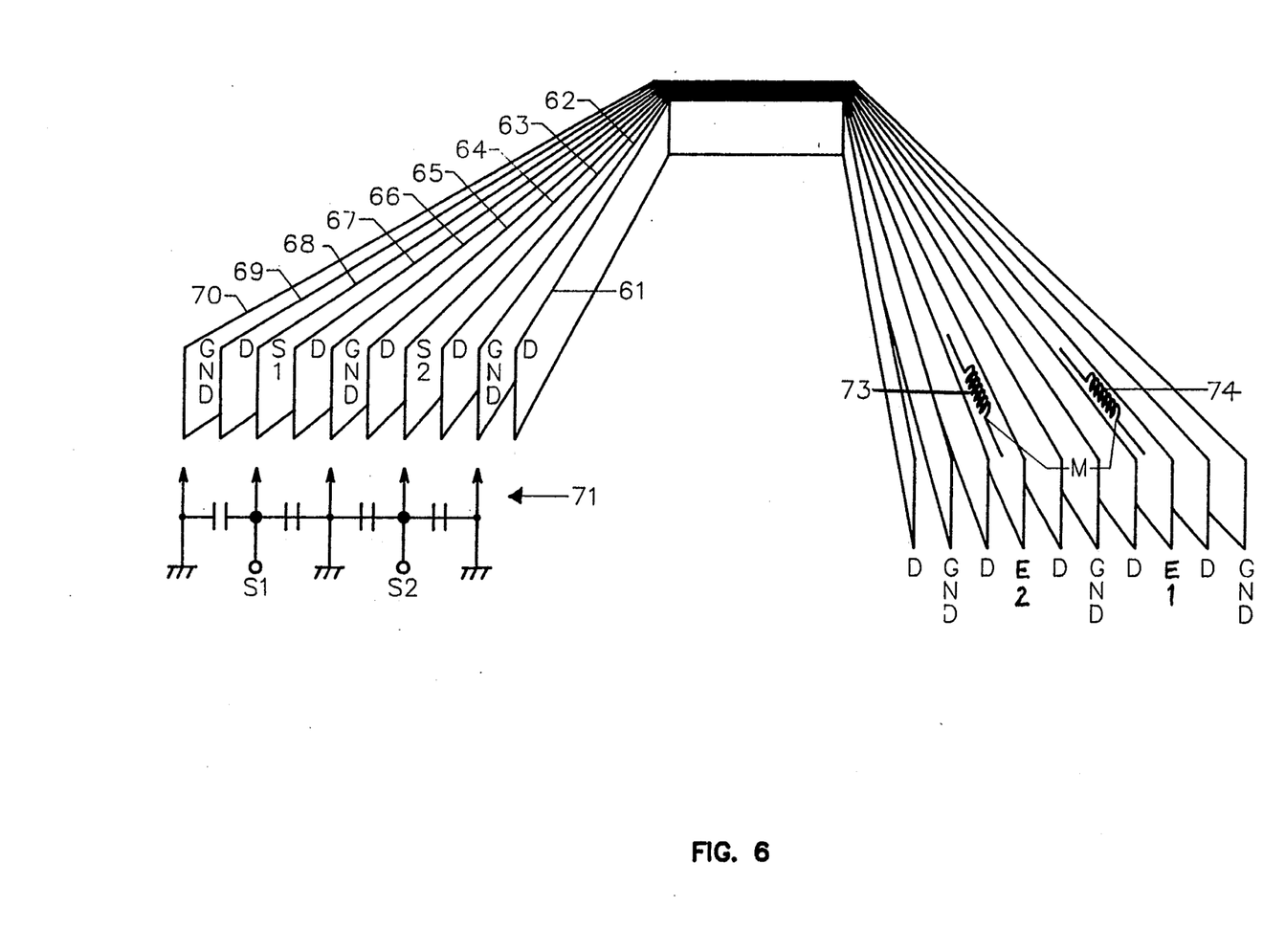
FIG. 6 shows interleaved elongated sheets of dielectric and conducting materials which can be wound into a coil, such as a spiral, for forming one version of a capacitive/inductive device according to the present invention.

The capacitive/inductive device according to the present invention is a sandwich of interleaved dielectric and conducting layers. As shown in FIG. 6, this sandwich includes elongated dielectric sheets 61, 63, 65, 67 and 69 and elongated sheets of conducting material 62, 64, 66, 68 and 70. Each of the sheets 61–70 forms a layer and each pair of dielectric and conducting sheets forms a pair of layers. Thus, the first pair of layers includes the dielectric sheet 61 and the conducting sheet 62, the second pair includes the dielectric sheet 63 and the conducting sheet 64, the third pair includes the dielectric sheet 65 and the conducting sheet 66, and so on.

As indicated in FIG. 6, the conducting sheets 62, 66 and 70 may be connected to ground and the conducting sheets 64 and 68 have respective first conductor ends S2 and S1 which may be connected to corresponding signal sides of the filter and respective second conductor ends E1 and E2 which may be connected to corresponding load side terminals. This arrangement provides the capacitances 71 between the various conducting sheets as illustrated in FIG. 6.

Figure 7:
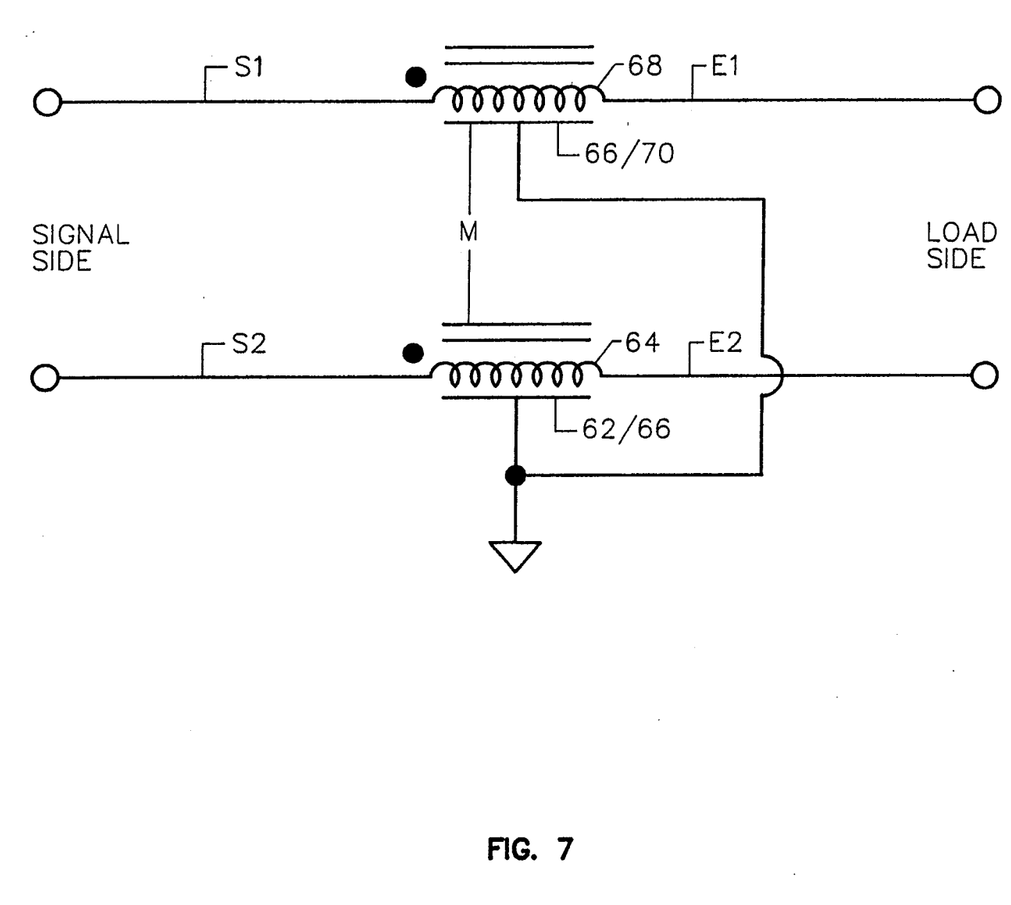
FIG. 7 shows the circuit equivalent of the capacitive-/inductive device of FIG. 6 connected as a common mode filter.
Figure 8:
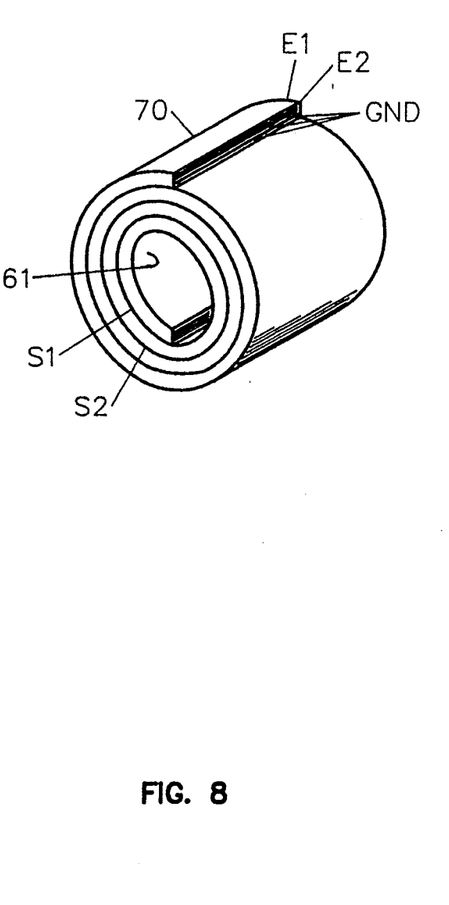
FIG. 8 shows a spiral winding of the dielectric and conducting sheets.
Figure 9:
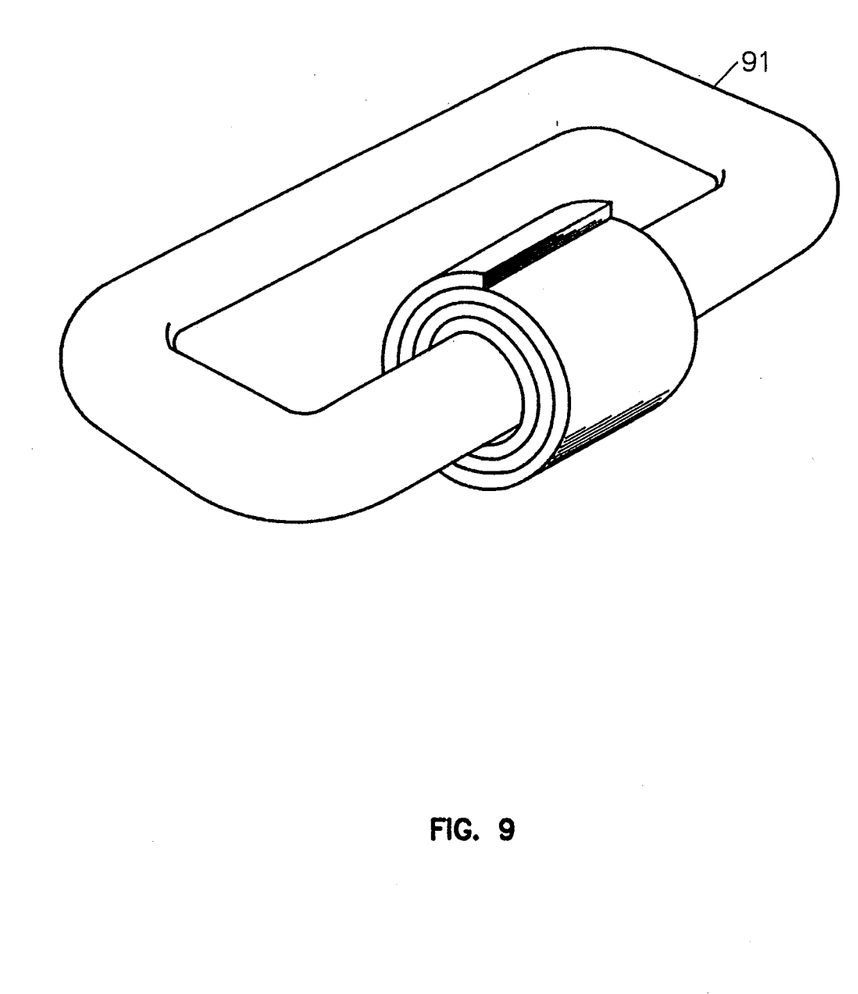
FIG. 9 shows a capacitive/inductive device wound about a ferromagnetic core.

When the sandwich construction shown in FIG. 6 is wound into a coil, such as the spiral shown in FIG. 8, a common mode capacitive/inductive filter results. The equivalent circuit for this filter is shown in FIG. 7. The conducting layer 68 forms an inductor (as shown by the inductor symbol 74 in FIG. 6) and the conducting layer 64 forms an inductor (as shown by the inductor symbol 73 in FIG. 6). The winding of the layers, especially when encircling a ferromagnetic core (such as ferromagnetic core 91 shown in FIG. 9), promotes a mutual inductance M between the inductive layers 64 and 68. The conducting layers 66 and 70, together with the conducting layer 68, form a capacitance having one plate 68 connected in the line S1/E1 and two plates 66 and 70 connected to ground. The conducting layers 62 and 66, together with the conducting layer 64, from a capacitance having one plate 64 connected in the line S2/E2 and two plates 62 and 66 connected to ground. The dielectric insulation layers 61, 63, 65, 67, and 69 are placed between the conductive sheets to prevent short circuits between the conducting sheets and to serve as dielectric layers for the capacitors. The resulting sandwich provides distributed capacitance between the signal and ground sheets. Stray capacitive coupling between the signal sheets is greatly reduced when the ground sheets 62, 66 and 70 are grounded.

As shown in FIG. 8, the sandwich construction shown in FIG. 6 may be wound into a spiral with the dielectric sheet 61 on the interior and the conducting ground sheet 70 on the exterior. A further dielectric sheet can be placed on the outside of the sandwich construction shown in FIG. 6 so that, when it is wound into a coil, such as the spiral shown in FIG. 8, the top or external layer will be a dielectric layer with the conducting layer 70 being the layer immediately below the external dielectric layer.

Alternatively, the sandwich construction shown in FIG. 6 can be wound in the opposite direction with the conducting layer 70 on the inside and the dielectric layer 61 on the outside. In this event, since the sandwich construction is typically wound around a ferromagnetic core, such as a ferromagnetic core 91 shown in FIG. 9, insulation between the coil and ferromagnetic core 91 may be required. This insulation can be provided by either a separate dielectric sleeve slipped over the core, or a dielectric coating on the core, or the like.

The capacitive/inductive device according to the present invention results in the simultaneous fabrication of a common mode choke and a distributed feed through capacitor. Both interwinding capacitance in the common mode choke and the majority of the distributed inductance of the capacitor are substantially eliminated. Thus, not only is the resulting device smaller and lighter than discrete component versions, it offers improved high frequency performance and bandwidth because the undesired stray elements are substantially eliminated. The resulting combined device is only slightly larger, by the volume of the additional ground layers and associated dielectric layers, than the common mode choke itself.

Furthermore, the ground layers providing the capacitance to ground not only reduce stray capacitance between the windings formed by the signal carrying layers, but also reduce stray capacitance between ends of the same signal carrying layer. A filter constructed according to the present invention is useful in suppressing transients, electromagnetic interference (EMI), electrostatic discharges (ESD), high intensity radio frequencies (HIRF), and surges caused by lightning. The capacitive/inductive device according the present invention can also be used, for example, in polyphase systems, computers, switching mode power supplies, and cellular phones. Furthermore, the capacitive/inductive device according the present invention can be used as one or more windings in transformer applications.

The capacitance of the capacitive/inductive device according to the present invention can be enhanced by increasing the number of layers in the stack shown in FIG. 6 before winding the layers into a coil, such as the spiral shown in FIG. 8. The inductance of the capacitive/inductive device according to the present invention can be enhanced by increasing the number of turns in the coil or by proper selection of the core 91 shown in FIG. 9. Instead of winding the layers 61–70 in the spiral shown in FIG. 8, the layers 61–70 may be wound in other coil arrangements. For example, the layers 61–70 may be wound helically or toroidally. Furthermore, instead of winding the layers 61–70 end to end, these layers may be wound edge to edge.

I claim:

1. A combined capacitive/inductive device, said capacitive/inductive device comprising a plurality of layers wound into a coil, said plurality of layers including, in order, a first sheet of dielectric material, a first sheet of conducting material, a second sheet of dielectric material, a second sheet of conducting material, a third sheet of dielectric material, a third sheet of conducting material, a fourth sheet of dielectric material, a fourth sheet of conducting material, a fifth sheet of dielectric material, and a fifth sheet of conducting material, said first, third, and fifth sheets of conducting material being connected to ground.

2. The device of claim 1 wherein each of said conducting sheets has first and second conducting ends, wherein said device further comprises a first electrical terminal connected to said second sheet of conducting material near said first conducting end of said second sheet of conducting material, a second electrical terminal connected to said fourth sheet of conducting material near said first conducting end of said fourth sheet of conducting material, a third electrical terminal connected to said second sheet of conducting material near said second conducting end of said second sheet of conducting material, and a fourth electrical terminal connected to said fourth sheet of conducting material near said second conducting end of said fourth sheet of conducting material.

3. The device of claim 2 wherein said device further comprises a ferromagnetic core and wherein said plurality of layers are wound about said ferromagnetic core.

4. The device of claim 3 wherein said plurality of layers are wound about said ferromagnetic core so that said first sheet of dielectric material faces said ferromagnetic core.

5. The device of claim 1 wherein said device further comprises a ferromagnetic core and wherein said plurality of layers are wound about said ferromagnetic core.

6. The device of claim 5 wherein said plurality of layers are wound about said ferromagnetic core so that said first sheet of dielectric material faces said ferromagnetic core.

7. A filter comprising a coil having a plurality of layers, said plurality of layers including, in order, a first sheet of dielectric material, a first sheet of conducting material, a second sheet of dielectric material, a second sheet of conducting material, a third sheet of dielectric material, a third sheet of conducting material, a fourth sheet of dielectric material, and a fourth sheet of conducting material, wherein said coil has first and second ends, wherein each of said conducting sheets has first and second conducting ends, wherein said filter further comprises a first electrical terminal connected near said first conducting end of one of said first and second sheets of conducting material, a second electrical terminal connected near said second conducting end of said one of said first and second sheets of conducting material, a third electrical terminal connected near said first conducting end of one of said third and fourth sheets of conducting material, and a fourth electrical terminal connected near said second conducting end of said one of said third and fourth sheets of conducting material, the other of said first and second sheets of conducting material being connected to ground, and the other of said third and fourth sheets of conducting material being connected to ground.

8. The device of claim 7 wherein said device further comprises a ferromagnetic core and wherein said layers are wound about said ferromagnetic core.

9. The device of claim 8 wherein said layers are wound about said ferromagnetic core so that said first sheet of dielectric material faces said ferromagnetic core.

10. A combined capacitive/inductive device, said capacitive/inductive device comprising a plurality of layers wound into a coil, said plurality of layers including, in order, a first sheet of dielectric material, a first sheet of conducting material, a second sheet of dielectric material, a second sheet of conducting material, a third sheet of dielectric material, a third sheet of conducting material, a fourth sheet of dielectric material, a fourth sheet of conducting material, a fifth sheet of dielectric material, and a fifth sheet of conducting material, wherein at least one of said sheets of conducting material is connected to ground and wherein all of said sheets of conducting material are of substantially the same size.

11. The device of claim 10 wherein said first, third and fifth sheets of conducting material are connected to ground.

12. The device of claim 11 wherein each of said conducting sheets has first and second conducting ends, wherein said device further comprises a first electrical terminal connected to said second sheet of conducting material near said first conducting end of said second sheet of conducting material, a second electrical terminal connected to said fourth sheet of conducting material near said first conducting end of said fourth sheet of conducting material, a third electrical terminal connected to said second sheet of conducting material near said second conducting end of said second sheet of conducting material, and a fourth electrical terminal connected to said fourth sheet of conducting material near said second conducting end of said fourth sheet of conducting material.

13. The device of claim 12 wherein said device further comprises a ferromagnetic core and wherein said plurality of layers are wound about said ferromagnetic core.

14. The device of claim 13 wherein said plurality of layers are wound about said ferromagnetic core so that first sheet of dielectric material faces said ferromagnetic core.

15. The device of claim 10 wherein said device further comprises a ferromagnetic core and wherein said plurality of layers are wound about said ferromagnetic core.

16. The device of claim 15 wherein said plurality of layers are wound about said ferromagnetic core so that said first sheet of dielectric material faces said ferromagnetic core.

* * * * *